US006782523B2

(12) United States Patent
DeGarmo et al.

(10) Patent No.: US 6,782,523 B2
(45) Date of Patent: Aug. 24, 2004

(54) PARALLEL CONFIGURABLE IP DESIGN METHODOLOGY

(75) Inventors: Randy DeGarmo, Eagan, MN (US); Sean Keller, Burnsville, MN (US)

(73) Assignee: LSI Logic Corporation, Milpitas, CA (US)

(*) Notice: Subject to any disclaimer, the term of this patent is extended or adjusted under 35 U.S.C. 154(b) by 101 days.

(21) Appl. No.: 10/271,026

(22) Filed: Oct. 15, 2002

(65) Prior Publication Data

US 2004/0073883 A1 Apr. 15, 2004

(51) Int. Cl.[7] ............................................. G06F 17/50
(52) U.S. Cl. ................................ 716/18; 716/1; 716/3
(58) Field of Search .................................. 716/1, 3, 18

(56) References Cited

U.S. PATENT DOCUMENTS

| 6,347,395 B1 | 2/2002 | Payne et al. ................... 716/18 |
| 2003/0055520 A1 * | 3/2003 | Tomii ........................... 700/97 |
| 2003/0126059 A1 * | 7/2003 | Hensley et al. ............... 705/36 |

OTHER PUBLICATIONS

Pillement et al., "Behavioral IP Specification and Integration Framework For High–Level Design Reuse," IEEE, Mar. 18–21, 2002, PP. 1–6.*
Ranjit et al., "Firm IP Development: Methodology & Deliverables," IEEE, May 21–24, 2000, PP. 529–532.*
Hatley, "Parallel System Development: A Reference Model for Case Tools," IEEE, 1990, PP. 364–372.*
Chan et al., "Software Configuration Management Tools," IEEE, 1997, PP. 238–250.*
Lee et al., "IP Development and Management of IP DB Enabling Effecient System–On–Chip Design," IEEE, Aug. 1999, PP. 229–232.*
Hasse, "Design Methodology for IP Providers," IEEE, Mar. 1999, PP. 1–5.*
Schlindler et al., "IP Repository, A Web Based IP Reuse Infrastructure," IEEE, May 1993, PP. 415–418.*
Bae et al., "A Single–Chip Programmable Platform Based on a Multithreaded Processor and Configurable Logic Clusters," IEEE, Feb. 3–7, 2002, PP. 1–2.*
"GNU Make" by Richard M. Stallman et al. (A Program for Directing Recompilation) GNU make Version 3.80 Free Software Foundation, Inc., 176 pages—Author(s)—Richard M. Stallman et al.

* cited by examiner

Primary Examiner—Vuthe Siek
(74) Attorney, Agent, or Firm—Suiter-West PC LLO

(57) ABSTRACT

The present invention is directed to a system and method for parallel configurable IP design. In an aspect of the present invention, a method may include receiving input parameters for a configuration by a common IP development environment. A unique combination of input parameters from the received input parameters is identified. At least one unique runtime file of the common IP development environment is initiated. The unique runtime file is derived from a common set of IP deliverables of the common IP development environment. At least one unique output file from the initiated unique runtime file is generated. The initiated unique runtime file and generated unique output file are unique so as to enable parallel implementation of the configuration specified by the received input parameter with at least one other configuration by the common IP development environment.

19 Claims, 3 Drawing Sheets

PARALLEL CONFIGURABLE IP DESIGN METHODOLOGY

FIELD OF THE INVENTION

The present invention generally relates to the field of design, and particularly to the ability to develop, in parallel, an unlimited number of IP configurations from a common set of IP deliverables to support multiple product configurations.

BACKGROUND OF THE INVENTION

Configurable IP provides customers with the ability to customize IP for product needs. However, developing many different IP configurations from a single development platform can be confusing and time consuming if the development environment is not setup efficiently.

IP deliverables today are typically provided in a format that allows for different configurations to be developed sequentially. Each time, the developer is required to input the configuration parameters and then start the development tools or scripts to build that single configuration. If a different configuration is also required, the IP, tools and scripts must be copied to a redundant working environment prior to start of development to avoid over writing run-time or output files for the previous configuration.

Therefore, it would be desirable to provide a system and method for parallel configurable IP design.

SUMMARY OF THE INVENTION

Accordingly, the present invention is directed to a system and method for parallel configurable IP design. In an aspect of the present invention, a method includes receiving input parameters for a configuration by a common IP development environment. A unique combination of input parameters from the received input parameters is identified. At least one unique runtime file of the common IP development environment is initiated. The unique runtime file is derived from a common set of IP deliverables of the common IP development environment. At least one unique output file from the initiated unique runtime file is generated. The initiated unique runtime file and generated unique output file are unique so as to enable parallel implementation of the configuration specified by the received input parameter with at least one other configuration by the common IP development environment.

In an additional aspect of the present invention, a development environment implemented by an information handling system includes a common IP development environment including a plurality of common IP deliverables. Unique runtime files and unique output files are provided for parallel development of at least two configurations based on the common IP deliverables. The unique runtime files and unique output files may be specified as unique through use of a naming convention.

In a further aspect of the present invention, a system includes a memory suitable for storing a program of instructions and a processor communicatively coupled to the memory. The processor is suitable for performing the program of instructions, in which, the program of instructions configures the processor to identify a unique combination of input parameters from the received input parameters for a first configuration received by a common IP development environment implemented by the program of instructions. At least one unique runtime file of the common IP development environment is initiated. The unique runtime file is derived from a common set of IP deliverables of the common IP development environment. At least one unique output file from the initiated unique runtime file is generated. The initiated unique runtime file and generated unique output file are made unique through use of a naming convention so as to enable parallel implementation of the unique runtime files and generated unique output files corresponding to at least two configurations.

In an aspect of the present invention, a method includes receiving input parameters for a first configuration by a common IP development environment. A unique combination of input parameters from the received input parameters is identified. At least one unique runtime file of the common IP development environment is initiated. The unique runtime file is derived from a common set of IP deliverables of the common IP development environment. At least one unique output file from the initiated unique runtime file is generated. The initiated unique runtime file and generated unique output file are made unique through use of a naming convention so as to enable parallel implementation of the unique runtime file and generated unique output file of the first configuration with a unique runtime file and unique output file of a second configuration by the common IP development environment.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Figure 1:
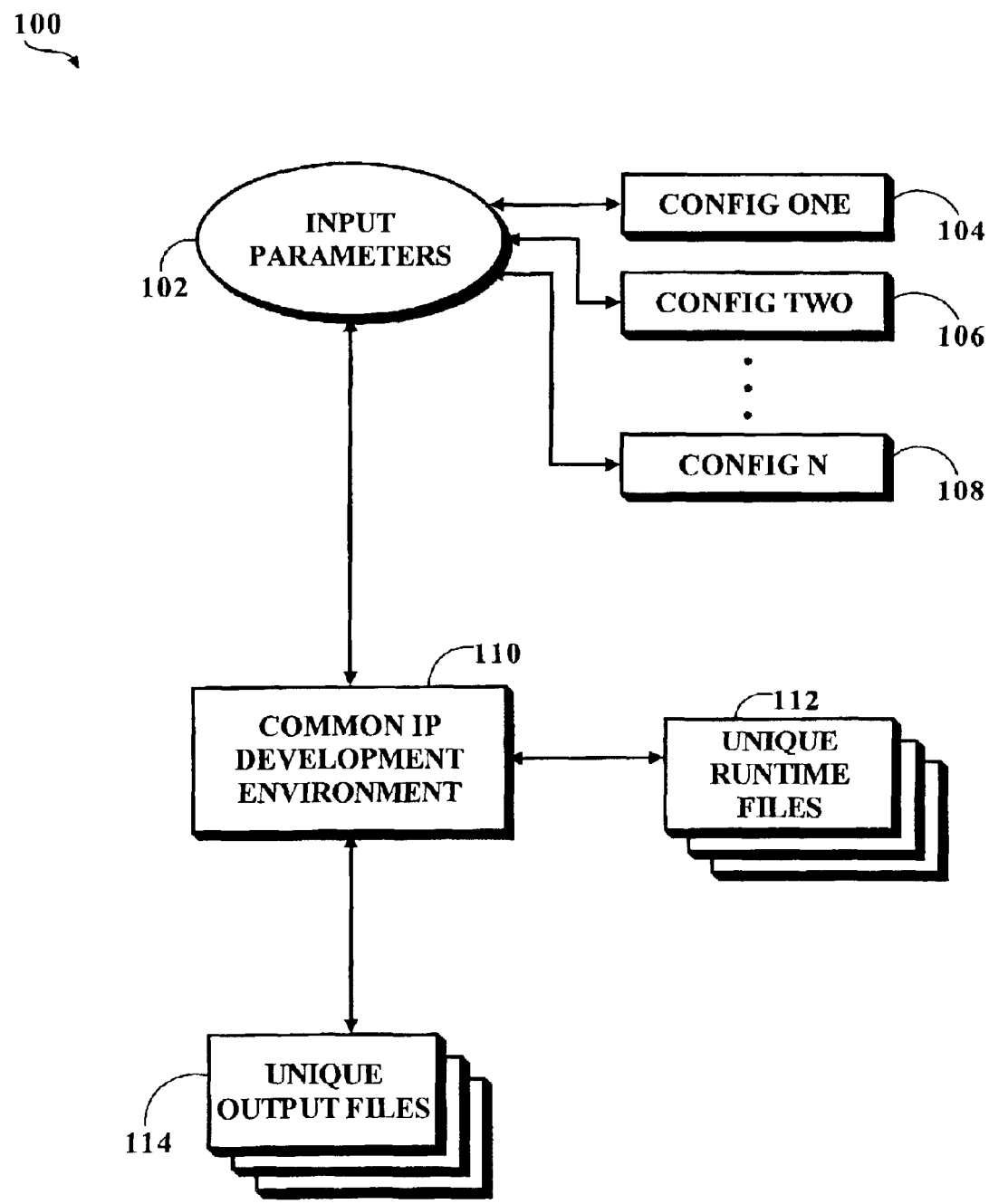
FIG. 1 is a block diagram of an exemplary embodiment of the present invention wherein a common IP development environment is utilized to provide customer specific solutions.
Figure 2:
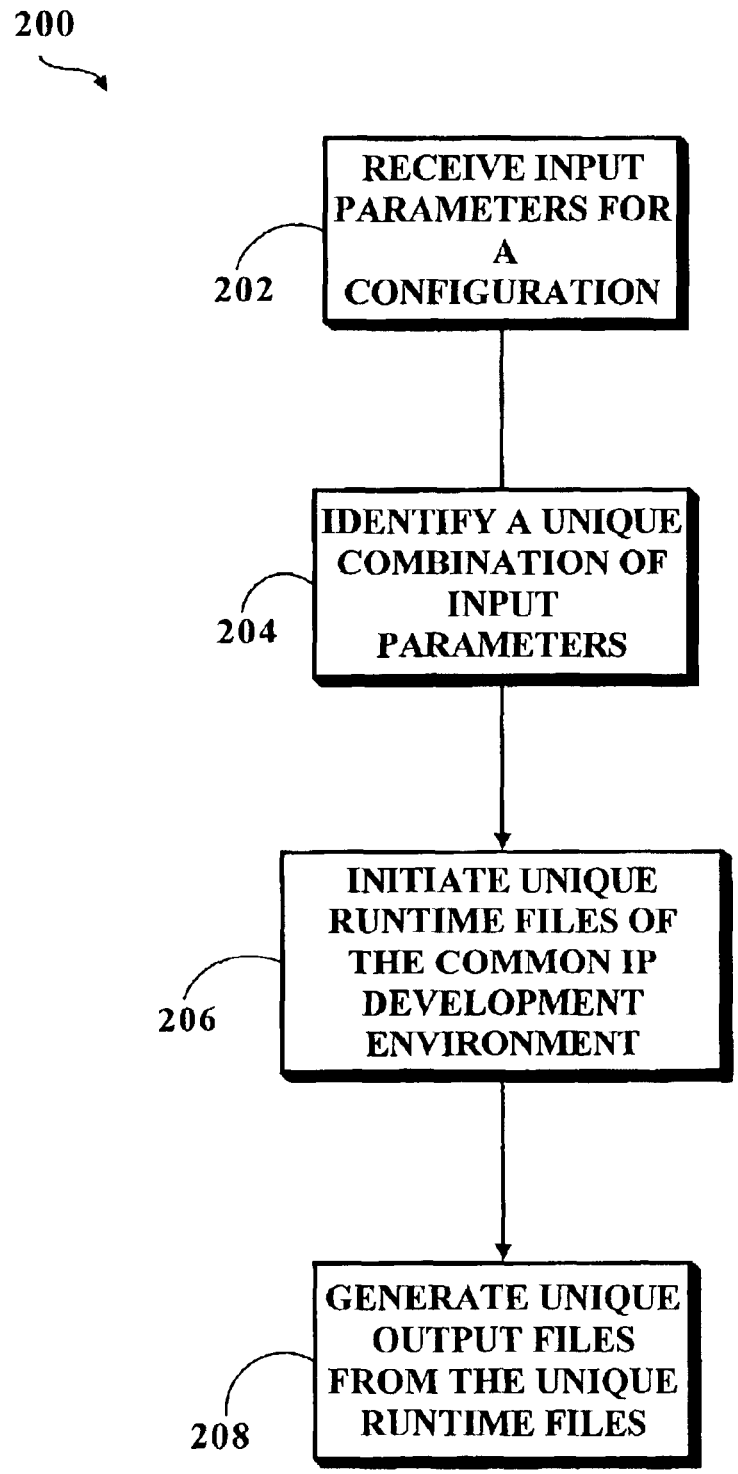
FIG. 2 is a flow diagram depicting an exemplary method of the present invention wherein an identified unique combination of input parameters is utilized to provide unique runtime and output files.
Figure 3:
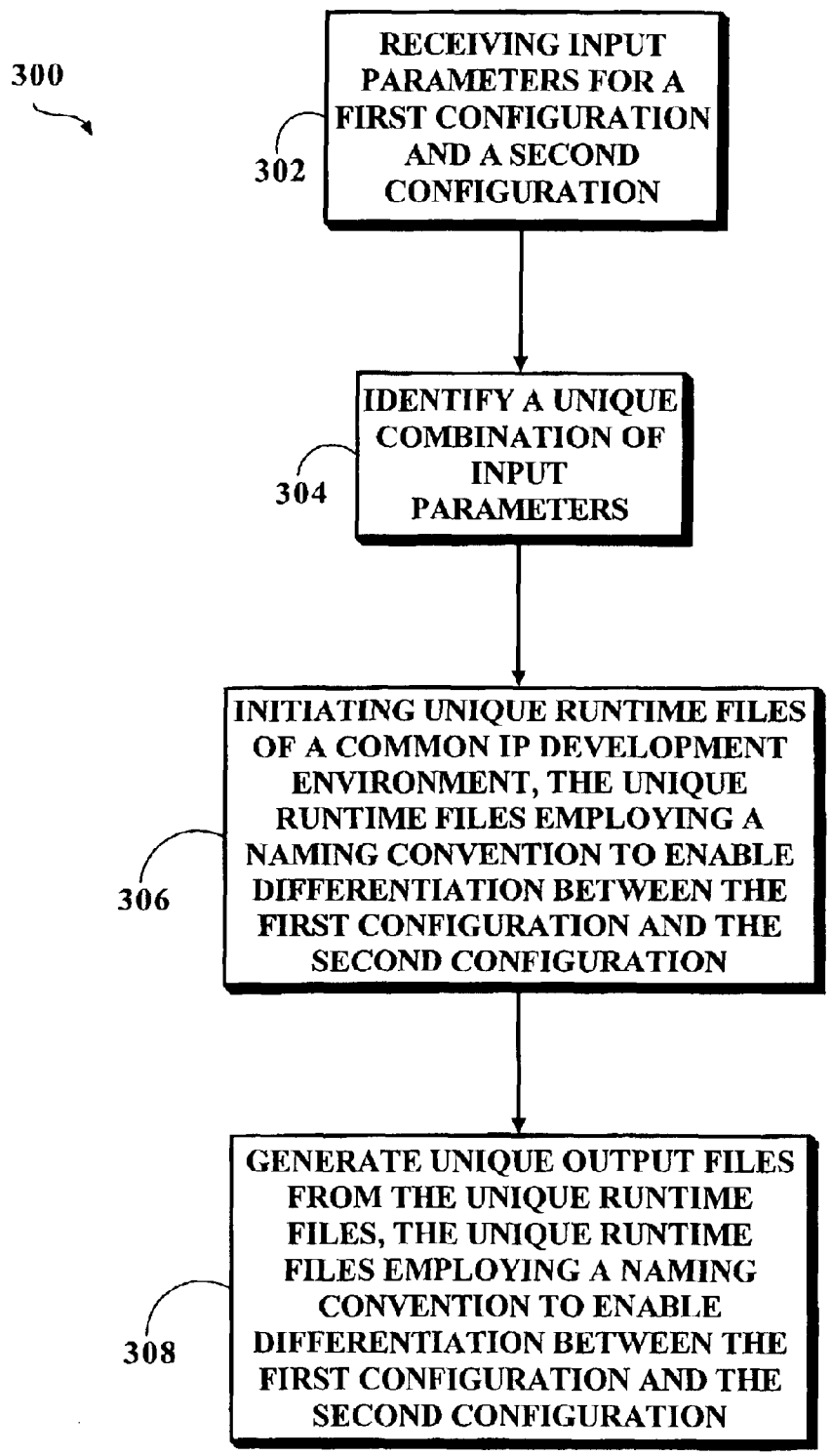
FIG. 3 is a flow diagram illustrating an exemplary method of the present invention wherein differing configurations are addressed in parallel by a common IP development environment.

Referring generally now to FIGS. 1 through 3, exemplary embodiments of the present invention are shown. Previously, a single IP configuration was developed from a single IP development environment. If other configurations were needed, a duplicate IP development environment was needed to avoid issues with runtime files and/or output files overwriting each other. Consequently, each output was unique, as each development environment was unique.

The disadvantage of existing IP development environments is that the environment required a separate IP development environment for each customer configuration. This necessitated additional support and resources needed to develop and maintain each environment. Additionally, if a bug was found in a common IP development environment, each development environment had to be updated and checked against each other environment for correctness. This redundancy led to design errors, with some customer configurations not receiving the updates to the environment. Also, employing the previous method, if all configurations were built within the same IP development environment, runtime and output files would overwrite each other, causing loss of data or incorrect results. One method utilized to address these concerns was to provide parallelism through the use of a CPU server farm. However, this method did not make modifications to the IP development environment to avoid overwriting of output data, which would have destroyed results on each successive development. Further, the previous methods made it difficult to generate accurate, timely data about multiple configurations for pre-sales support, thereby greatly reducing the competitiveness of the manufacturer which provided such goods.

The present invention provides a system and method for enhancing an IP development environment so that an unlimited number of configurations may be developed in parallel from a single IP development area. By developing many configurations in parallel, time-to-market for all customers may be improved, as opposed to previous instances in which only the customer for which the development area was employed derived a benefit.

By developing several IP configurations from the same IP development environment, design errors may be eliminated that could be introduced by having to support and debug multiple copies of the same IP. If a bug is found and fixed in the original IP for a given customer configuration, then all configurations will receive this update in parallel, and be fixed simultaneously. This will significantly decrease turn-around time for bug fixes and enhancements to the IP for all customer configurations.

Referring now to FIG. 1, an exemplary embodiment 100 of the present invention is shown wherein a common IP development environment is utilized to provide customer specific solutions. The figure shows how the invention makes use of a common IP development environment to produce an unlimited number of unique output files (customer configurations). Each unique output may be developed in parallel, thereby decreasing time-to-market for multiple IP development. Additionally, a single resource may support the IP development environment, and develop many customer configurations.

For example, a variety of input parameters 102, such as configuration one 104, configuration two 106 through configuration N 108 may be provided to a common IP development environment 110. The common IP development environment 110 initiates unique runtime files 112 for the received input parameters 102. Thus, the common IP development environment 110 may provide unique output files 114 through use of the unique runtime files 112. Further, because of the uniqueness of the runtime files 112, a plurality of input parameters 102 may be received and implemented by the common IP development environment 110 in parallel, without affecting the other implemented files in the environment.

Referring now to FIG. 2, an exemplary method of the present invention is shown wherein an identified unique combination of input parameters is utilized to provide unique runtime and output files. A common IP development environment receives input parameters for a configuration 202. A unique combination of input parameters is identified 204. For example, a different combination of variables, values of variables, and the like may be interpreted by the design environment to indicate that a unique configuration has been received. Unique runtime files of the common IP development environment are initiated 206, which generate unique output files 208. In this way, the present invention may provide concurrent running of differing configurations through an IP environment.

There are a variety of ways that the present invention may handle unique customer configurations in parallel. For example, a strict naming convention may be employed for both run-time and output files, so that all configurations running in parallel may have unique results. For instance, input parameters may specify a configuration and thus inform the scripts of the development environment which configuration is to be built. The input parameters combine to drive the configuration-independent IP and scripts in the IP development environment to build and analyze a customer-defined IP configuration. Each time the IP development script is started with a unique combination of input parameters, a unique set of run-time and output files is generated in parallel with any other IP configuration that has been or is being executed in the IP development environment.

For instance, referring now to FIG. 3, an exemplary method 300 of the present invention is shown wherein differing configurations are addressed in parallel by a common IP development environment. Input parameters are received for a first configuration and a second configuration 302. The first configuration and the second configuration are identified as unique based on the received input parameters 304. Therefore, unique runtime files of a common IP development environment are initiated 306. The unique runtime files employ a naming convention to enable differentiation between runtime files associated with the first configuration as opposed to runtime files associated with the second configuration. Unique output files are then generated from the unique runtime files 308. The unique output files also employ a naming convention to enable differentiation between the first configuration and the second configuration.

Thus, the present invention may provide an IP development environment in which all runtime and output files are unique for each customer configuration. These changes include but are not limited to providing unique directories and files names that are generated by the IP development environment so that all resulting files are retained with characteristics unique to the customer-defined IP configuration. The IP development environment allows each configuration to use a common set of IP files so that each result is functionally identical to any other result.

This invention allows for the parallel development of an unlimited number of IP configurations. Further, the present invention supports full configurability of all possible customer configurations, while allowing for each customer configuration to be developed in parallel from one IP development environment.

By developing multiple IP configurations in parallel, the overall time-to-market for all customer configurations requested may decrease to the amount of time it would take to develop a single configuration, thereby fulfilling a long-felt need in the industry. Additionally, by using a common IP development environment for each configuration, risk of design error is reduced substantially. As soon as the common IP development area is debugged and built for one configuration, all other configurations developed from that environment are correct-by-design.

Also, by developing multiple configurations in a single development environment, relative comparisons of results from each configuration may be made quickly and easily. Comparing results between configurations (i.e. different outputs from different parameters) may help customers quickly understand which configuration would be best for a contemplated design platform. Another advantage of developing unlimited configurations in parallel is the ability to pre-generate output data for a wide range of configurations, allowing customers to accurately interpolate or extrapolate results from configurations that are yet to be developed.

There are a variety of input parameters contemplated by the present invention without departing from the spirit and scope thereof. For example, input parameters may include source library choice, whether to employ clock gating, cache size for a processor, whether to insert test structures, source data such as RTL, C, and C++, and the like. Further, the methodology may be applied in any number of IP design environments where parallelism could benefit productivity, including design of cores for microprocessors, peripherals and other 3rd party and customer IP.

Thus, the present invention provides the ability to develop, in parallel, an unlimited number of IP configurations from a common set of IP deliverables.

As the number of unique customer-defined configurations increases and the time-to-market for each customer decreases both in pre-sales and post-sales, IP developers need to be able to produce many configurations in parallel without risk of error. This invention significantly reduces the time and amount of resources required to develop each unique configuration. Also, by re-using a common IP development environment, each unique output is correct-by-design, and modifications to the common IP development environment impact all configurations simultaneously. These improvements in the design flow automation may save considerable amounts of money for the development group in reduced resource requirements, reduced risk, and also increase customer and supplier revenue by decreasing time-to-market.

In exemplary embodiments, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

Although the invention has been described with a certain degree of particularity, it should be recognized that elements thereof may be altered by persons skilled in the art without departing from the spirit and scope of the invention. One of the embodiments of the invention can be implemented as sets of instructions resident in the memory of one or more information handling systems, which may include memory for storing a program of instructions and a processor for performing the program of instruction, wherein the program of instructions configures the processor and information handling system. Until required by the information handling system, the set of instructions may be stored in another readable memory device, for example in a hard disk drive or in a removable medium such as an optical disc for utilization in a CD-ROM drive and/or digital video disc (DVD) drive, a compact disc such as a compact disc-rewriteable (CD-RW), compact disc-recordable and erasable; a floppy disk for utilization in a floppy disk drive; a floppy/optical disc for utilization in a floppy/optical drive; a memory card such as a memory stick, personal computer memory card for utilization in a personal computer card slot, and the like. Further, the set of instructions can be stored in the memory of an information handling system and transmitted over a local area network or a wide area network, such as the Internet, when desired by the user.

Additionally, the instructions may be transmitted over a network in the form of an applet that is interpreted or compiled after transmission to the computer system rather than prior to transmission. One skilled in the art would appreciate that the physical storage of the sets of instructions or applets physically changes the medium upon which it is stored electrically, magnetically, chemically, physically, optically or holographically so that the medium carries computer readable information.

It is believed that the system and method of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A method, comprising:
   receiving input parameters for a configuration by a common IP development environment;
   identifying a unique combination of input parameters from the received input parameters;
   initiating at least one unique runtime file of the common IP development environment, the unique runtime file derived from a common set of IP deliverables of the common IP development environment; and
   generating at least one unique output file from the initiated unique runtime file;
   wherein the initiated unique runtime file and generated unique output file are unique so as to enable parallel implementation of the configuration specified by the received input parameters with at least one other configuration by the common IP development environment.

2. The method as described in claim 1, wherein the unique runtime file and unique output file employ a naming convention to enable differentiation between respective originating configurations.

3. The method as described in claim 1, further comprising comparing the generated unique output file for the received configuration with a second generated unique output file for a second configuration.

4. The method as described in claim 1, wherein the configuration is for at least one of a core for a microprocessor, integrated circuit and peripheral device.

5. The method as described in claim 1, wherein the input parameters include at least one of source library choice, clock gating, cache size, test data and source code.

6. The method as described in claim 1, wherein the common set of IP deliverables of the common IP development environment enable a correction to one deliverable of the environment to be effective for all unique runtime files initiated from that deliverable.

7. A method, comprising:
receiving input parameters for a first configuration by a common IP development environment;
identifying a unique combination of input parameters from the received input parameters;
initiating at least one unique runtime file of the common IP development environment, the unique runtime files derived from a common set of IP deliverables of the common IP development environment; and
generating at least one unique output file from the initiated unique runtime file;
wherein the initiated unique runtime file and generated unique output file are made unique through use of a naming convention so as to enable parallel implementation of the unique runtime file and generated unique output file of the first configuration with a unique runtime file and unique output file of a second configuration by the common IP development environment.

8. The method as described in claim 7, wherein the naming convention enables differentiation between respective originating configurations.

9. The method as described in claim 7, further comprising comparing the generated unique output file for the received configuration with a second generated unique output file for the second configuration.

10. The method as described in claim 7, wherein the configuration is for at least one of a core for a microprocessor, integrated circuit and peripheral device.

11. The method as described in claim 7, wherein the input parameters include at least one of source library choice, clock gating, cache size, test data and source code.

12. The method as described in claim 7, wherein the common set of IP deliverables of the common IP development environment enable a correction to one deliverable of the environment to be effective for all unique runtime tiles initiated from that deliverable.

13. A system, comprising:
a memory suitable for storing a program of instructions; and
a processor communicatively coupled to the memory, the processor is suitable for performing the program of instructions, wherein the program of instructions configures the processor to
identify a unique combination of input parameters from received input parameters for a configuration received by a common IP development environment implemented by the program of instructions;
initiate at least one unique runtime file of the common IP development environment, the unique runtime file derived from a common set of IP deliverables of the common IP development environment; and
generate at least one unique output file from the initiated unique runtime file;
wherein the initiated unique runtime file and generated unique output file are made unique through use of a naming convention so as to enable parallel implementation of the unique runtime files and generated unique output files corresponding to at least two configurations.

14. The system as described in claim 13, wherein the naming convention enables differentiation between respective originating configurations.

15. The system as described in claim 13, further comprising comparing the generated unique output file for the received configuration with a second generated unique output file for a second configuration.

16. The system as described in claim 13, wherein the configuration is for at least one of a core for a microprocessor, integrated circuit and peripheral device.

17. The system as described in claim 13, wherein the input parameters include at least one of source library choice, clock gating, cache size, test data and source code.

18. The system as described in claim 13, wherein the common set of IP deliverables of the common IP development environment enable a correction to one deliverable of the environment to be effective for all unique runtime files initiated from that deliverable.

19. A development environment implemented by an information handling system, comprising:
a common IP development environment including a plurality of common IP deliverables, wherein unique runtime files and unique output files are provided for parallel development of at least two configurations based on the common IP deliverables, and
wherein the unique runtime files and unique output files are specified as unique through use of a naming convention.

* * * * *